US008274416B2

(12) United States Patent  
Kawaguchi et al.

(10) Patent No.: US 8,274,416 B2  
(45) Date of Patent: Sep. 25, 2012

(54) DA CONVERTER, SOLID-STATE IMAGING DEVICE, AND CAMERA SYSTEM

(75) Inventors: Takashi Kawaguchi, Nagasaki (JP); Ryugi Yoshimura, Nagasaki (JP)

(73) Assignee: Sony Corporation, Tokyo (JP)

( * ) Notice: Subject to any disclaimer, the term of this patent is extended or adjusted under 35 U.S.C. 154(b) by 301 days.

(21) Appl. No.: 12/762,040

(22) Filed: Apr. 16, 2010

(65) Prior Publication Data

US 2010/0271521 A1 Oct. 28, 2010

(30) Foreign Application Priority Data

Apr. 24, 2009 (JP) ................................ 2009-105929

(51) Int. Cl.  
*H03M 1/66* (2006.01)

(52) U.S. Cl. ...... 341/144; 348/308; 250/332; 250/338.2; 327/94; 372/38.01; 372/38.02; 372/38.07

(58) Field of Classification Search .......... 341/144–165; 348/308; 372/38.01, 38.02, 38.07, 512; 250/332, 250/338.2; 327/94–96  
See application file for complete search history.

(56) References Cited

U.S. PATENT DOCUMENTS

| 6,498,332 | B2 * | 12/2002 | Funakoshi | 250/208.1 |
| 7,236,017 | B2 * | 6/2007 | Luh | 327/94 |
| 7,573,922 | B2 * | 8/2009 | Kamatani et al. | 372/38.01 |
| 7,693,196 | B2 * | 4/2010 | Kamatani et al. | 372/38.01 |
| 7,718,966 | B2 * | 5/2010 | Ueno | 250/338.4 |
| 7,973,570 | B2 * | 7/2011 | Pigott et al. | 327/95 |
| 8,021,042 | B1 * | 9/2011 | Aslan et al. | 374/178 |

FOREIGN PATENT DOCUMENTS

| JP | 2000-152082 | 5/2000 |
| JP | 2002-232291 | 8/2002 |
| JP | 2007-059991 | 3/2007 |

* cited by examiner

*Primary Examiner* — Lam T Mai  
(74) *Attorney, Agent, or Firm* — SNR Denton US LLP

(57) ABSTRACT

A digital-to-analog (DA) converter includes: an analog output section that generates an output current corresponding to a value of a digital signal in response to a bias voltage and outputs an analog signal which is obtained from the output current by current-to-voltage conversion; a current source; a current control section that converts a current from the current source to a voltage signal and outputs the voltage signal as the bias voltage; and a sample and hold circuit section that samples and holds the bias voltage from the current control section and supplies the held bias voltage to the analog output section.

5 Claims, 16 Drawing Sheets

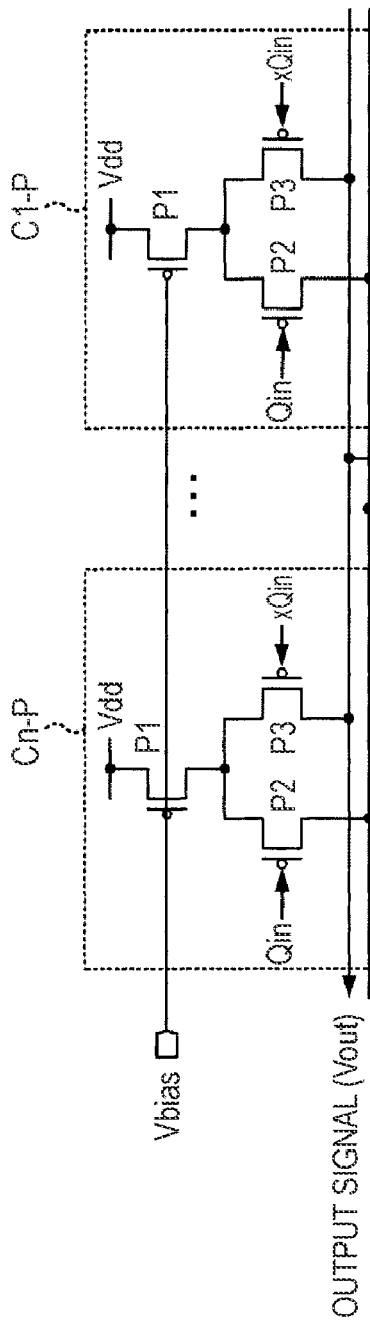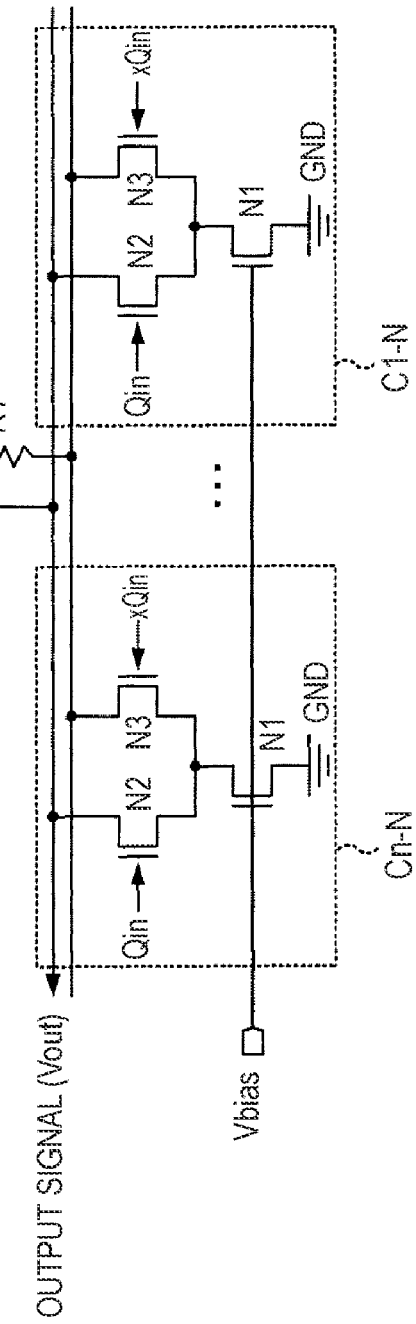
FIG.1A
FIG.1B

FIG.13

DA CONVERTER, SOLID-STATE IMAGING DEVICE, AND CAMERA SYSTEM

BACKGROUND OF THE INVENTION

1. Field of the Invention

The present invention relates to a DA converter that can be applied to a solid-state imaging device represented by a CMOS image sensor, a solid-state imaging device, and a camera system.

2. Description of the Related Art

A current-controlled digital-to-analog (DA) converter (hereinafter referred to as a DA converter) is generally configured to include a plurality of basic current source cells generating a constant current and an output resistor serving as a current-to-voltage converter.

FIGS. 1A and 1B are diagrams showing an exemplary configuration of a current-controlled DA converter having a basic current source cell.

FIG. 1A shows an exemplary basic configuration of the DA converter when a ground potential GND is used as a reference potential, and FIG. 1B shows an exemplary basic configuration of the DA converter when a power supply potential Vdd is used as a reference potential.

The basic current source cells C1-P to Cn-P shown in FIG. 1A each have p-channel MOS (PMOS) transistors P1 to P3 and an output resistor R1.

The basic current source cells C1-N to Cn-N shown in FIG. 1B each have n-channel MOS (NMOS) transistors N1 to N3 and an output resistor R1.

The value of the current flowing in the basic current source cells C1-P to Cn-P or C1-N to Cn-N is determined by a predetermined bias voltage Vbias. Then, a selection transistor pair P2/P3 or N2/N3 supplies the current to the output resistor R1 from the power supply line Vdd or ground line GND which is at the reference potential.

In this way, the current-controlled DA converter generates a desired output voltage Vout by using the output resistor R1 as a current supply destination of the plurality of basic current source cells Cn.

FIG. 2 is a diagram showing a specific example of a DA converter having a reference current generating section and a noise propagation path in a circuit.

The DA converter shown in FIG. 2 corresponds to the configuration shown in FIG. 1A and has a reference current generating section B1.

In many cases, the bias voltage Vbias that determines the current value of the basic current source cells C1-P to Cn-P is generated by a mirror connection established by a current mirror circuit that connects a reference current generated from the constant reference voltage Vref, which exhibits a strong temperature or process variation, via the reference current generating section B1 to the basic current source cells.

Such a current-controlled DA converter is used in an analog-to-digital converter (hereinafter referred to as an AD converter) that converts an analog pixel signal of a solid-state imaging device (image sensor), in which unit pixels are arranged in a matrix form, to a digital signal.

Examples of a solid-state imaging device having this kind of AD converter are disclosed in JP-A-2000-152082, JP-A-2002-232291, and JP-A-2007-059991, for example.

According to the solid-state imaging device disclosed in Patent Documents mentioned above, a voltage comparing section compares an analog pixel signal selected for each line or pixel with a reference voltage (ramp wave RAMP) which varies uniformly for the conversion into a digital signal.

Moreover, in the solid-state imaging device, a counter section performs a count operation concurrently with the comparing operation, and a digital signal corresponding to the pixel signal is obtained based on a count value at the time of completion of the comparing operation.

Specifically, JP-A-2000-152082 discloses an image sensor, JP-A-2002-232291 discloses an analog-to-digital converter and an image sensor using the same, and JP-A-2007-059991 discloses a DA converter, an AD converter, and a semiconductor device.

SUMMARY OF THE INVENTION

However, in the above-described DA converter, thermal noise or 1/f noise generated in the circuit is superimposed in the reference voltage Vref being used, which may propagate through the basic current source cell to become a source of noise appearing in the output signal.

For this reason, in many cases, to suppress the influence of noise, an LPF (Low-Pass Filter) is inserted in the DA converter so as to limit the bandwidth of noise which has been included in the reference voltage Vref.

Moreover, the reference current generating section B1 and the basic current source cell Cn themselves may generate thermal noise or 1/f noise, which may become another source of the noise appearing in the output signal Vout.

Therefore, the current-controlled DA converter described above needs to include components such as LPFs or BPFs (Band-Pass Filters) for suppressing the influence of noise appearing in the reference voltage Vref; specifically, large capacitors or resistor elements are necessary.

Moreover, the DA converter has a problem in that the noise appearing in the reference voltage Vref or the noise generated in the reference current generating circuit B1 or the basic current source cell Cn generates noise appearing in the output signal Vout of the DA converter, thus deteriorating accuracy of the output signal Vout.

Moreover, the use of the output signal Vout of the current-controlled DA converter as the reference voltage (RAMP) of the AD converter of the solid-state imaging device may cause the following disadvantages.

That is, the thermal noise or 1/f noise appearing in the reference voltage (RAMP) is difficult to be removed by signal processing such as correlated double sampling due to its randomness. Thus, such noise remains as noise components in the pixel signal obtained through AD conversion, thus becoming the cause of deterioration in the quality of final images.

It is therefore desirable to provide a DA converter capable of reducing the influence on a current output, of thermal noise or 1/f noise generated in a device without increasing a circuit dimension and thus achieving improvement in image quality. It is also desirable to provide a solid-state imaging device and a camera system employing the DA converter.

A digital-to-analog (DA) converter according to an embodiment of the present invention includes an analog output section that generates an output current corresponding to a value of a digital signal in response to a bias voltage and outputs an analog signal which is obtained from the output current by current-to-voltage conversion; a current source; a current control section that converts a current from the current source to a voltage signal and outputs the voltage signal as the bias voltage; and a sample and hold circuit section that samples and holds the bias voltage from the current control section and supplies the held bias voltage to the analog output section.

A solid-state imaging device according to another embodiment of the present invention includes a pixel section including a plurality of pixels arranged in a matrix form, each of the pixels being configured to perform a photoelectric conversion; a pixel signal readout circuit that reads out a pixel signal from the pixel section in units of a plurality of pixels; and a DA converter that generates a reference voltage which is a ramp wave corresponding to a digital signal supplied thereto. The pixel signal readout circuit includes a plurality of comparators which is disposed to correspond to a column array of pixels, and to which the ramp reference voltage is supplied, each comparator being configured to compare the supplied reference voltage with a potential of a readout analog signal for pixels of the corresponding column, a plurality of latches which is disposed to correspond to the column array of pixels and the plurality of comparators, each latch being capable of counting a comparison time of the corresponding comparator and configured to stop counting when an output of the comparator is inverted, thus holding a count value corresponding to the comparison time. The DA converter includes an analog output section that generates an output current corresponding to a value of a digital signal in response to a bias voltage and outputs an analog signal which is obtained from the output current by current-to-voltage conversion; a current source; a current control section that converts a current from the current source to a voltage signal and outputs the voltage signal as the bias voltage; and a sample and hold circuit section that samples and holds the bias voltage from the current control section and supplies the held bias voltage to the analog output section.

A camera system according to still another embodiment of the present invention includes a solid-state imaging device; and an optical system that forms a subject image in the solid-state imaging device. The solid-state imaging device includes a pixel section including a plurality of pixels arranged in a matrix form, each of the pixels being configured to perform a photoelectric conversion; a pixel signal readout circuit that reads out a pixel signal from the pixel section in units of a plurality of pixels; and a DA converter that generates a reference voltage which is a ramp wave corresponding to a digital signal supplied thereto. The pixel signal readout circuit includes a plurality of comparators which is disposed to correspond to a column array of pixels, and to which the ramp reference voltage is supplied, each comparator being configured to compare the supplied reference voltage with a potential of a readout analog signal for pixels of the corresponding column, a plurality of latches which is disposed to correspond to the column array of pixels and the plurality of comparators, each latch being capable of counting a comparison time of the corresponding comparator and configured to stop counting when an output of the comparator is inverted, thus holding a count value corresponding to the comparison time. The DA converter includes an analog output section that generates an output current corresponding to a value of a digital signal in response to a bias voltage and outputs an analog signal which is obtained from the output current by current-to-voltage conversion; a current source; a current control section that converts a current from the current source to a voltage signal and outputs the voltage signal as the bias voltage; and a sample and hold circuit section that samples and holds the bias voltage from the current control section and supplies the held bias voltage to the analog output section.

According to the embodiments of the present invention, it is possible to reduce the influence on a current output, of thermal noise or 1/f noise generated in a device without increasing a circuit dimension and to thus achieve improvement in image quality.

BRIEF DESCRIPTION OF THE DRAWINGS

FIGS. 1A and 1B are diagrams showing an exemplary configuration of a current-controlled DA converter having a basic current source cell.

FIG. 13 is a block diagram showing more specifically an ADC group of the column-parallel ADC employed by the solid-state imaging device (CMOS image sensor) shown in FIG. 12.

DESCRIPTION OF THE PREFERRED EMBODIMENTS

Embodiments of the present invention will be described in connection with the accompanying drawings.

The description will be given in the following order:

1. First Embodiment (First Exemplary Configuration of DA Converter)

2. Second Embodiment (Second Exemplary Configuration of DA Converter)

3. Third Embodiment (Third Exemplary Configuration of DA Converter)

4. Fourth Embodiment (Fourth Exemplary Configuration of DA Converter)

5. Fifth Embodiment (Exemplary Overall Configuration of Solid-State Imaging Device); and 6. Sixth Embodiment (Exemplary Configuration of Camera System)

<1. First Embodiment>

[First Exemplary Configuration of DA Converter]

Figure 2:
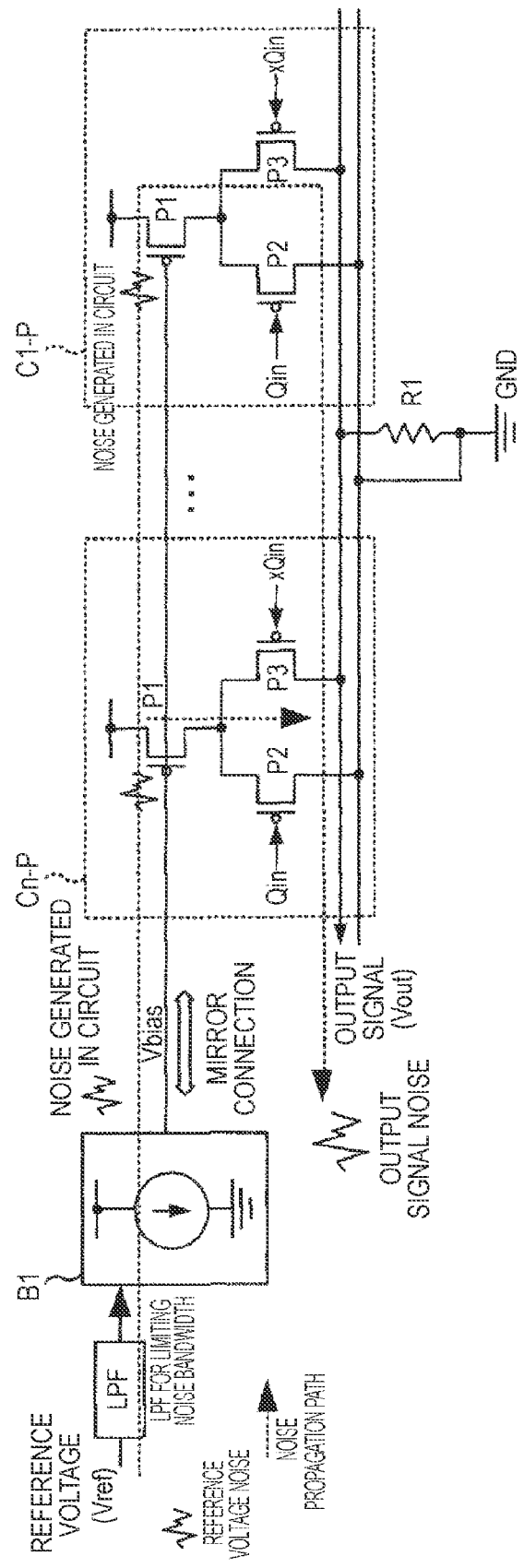
FIG. 2 is a diagram showing a specific example of a DA converter having a reference current generating section and a noise propagation path in a circuit.
Figure 3:
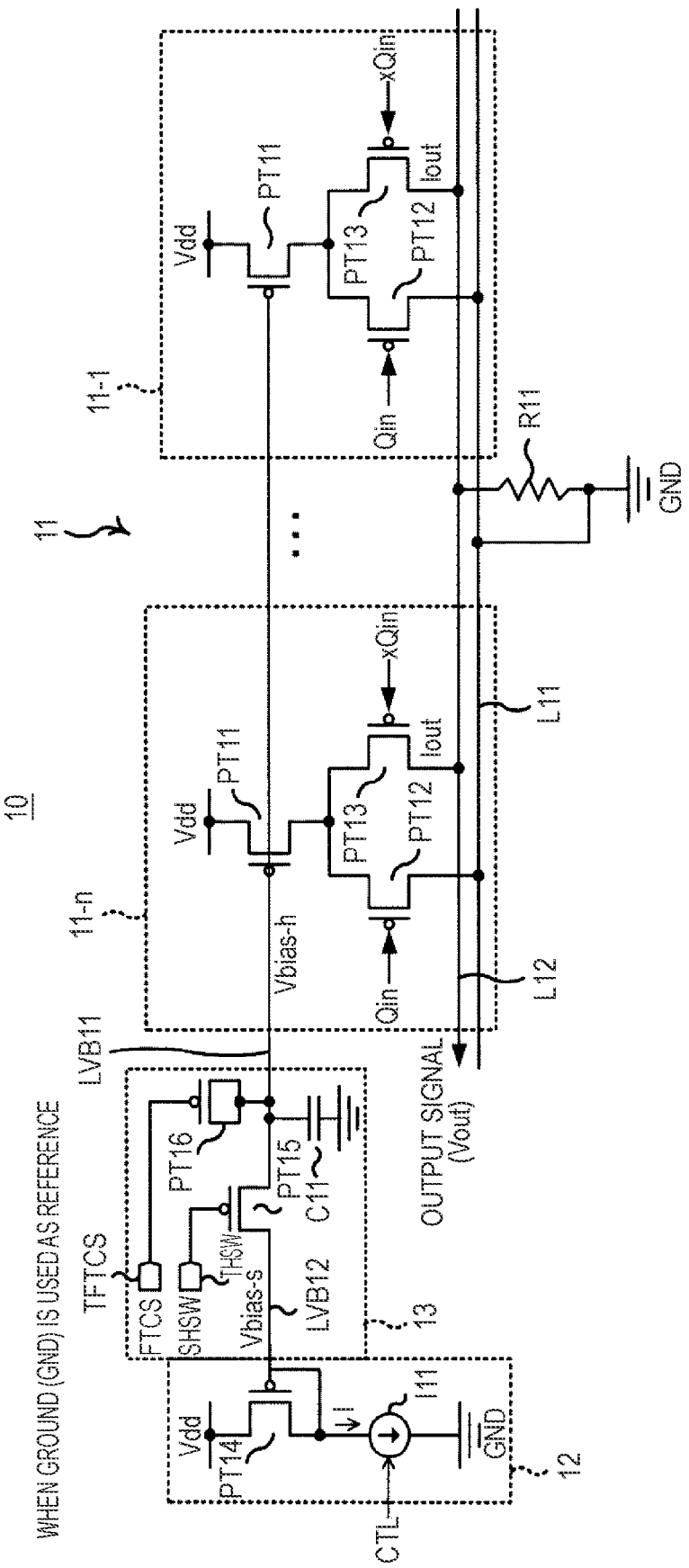
FIG. 3 is a circuit diagram showing an exemplary configuration of a DA converter according to a first embodiment of the present invention.

FIG. 3 is a circuit diagram showing an exemplary configuration of a DA converter according to the first embodiment of the present invention.

This DA converter 10 according to the first embodiment has an analog output section 11, a current control section 12, a sample and hold circuit section 13, a first bias line LVB11, and a second bias line LVB12.

The analog output section 11 has a function of generating an output current corresponding to the value of a digital signal in response to a bias voltage and outputting an analog signal which is obtained from the output current by current-to-voltage conversion.

The analog output section 11 has basic current source cells 11-1 to 11-n, a non-output line L11, an output line L12, and an output resistor R11.

The DA converter 10 has a sample and hold circuit section 13 that samples and holds a bias voltage Vbias of the basic current source cells 11-1 to 11-n of the analog output section 11.

The DA converter 10 shows a case where the ground potential (GND) is used as a reference potential.

The basic current source cells (C) 11-1 to 11-n have a common configuration.

That is to say, each of the basic current source cells 11 (11-1 to 11-n) has PMOS transistors PT11 to PT13.

In each basic current source cell 11 (11-1 to 11-n), the PMOS transistor PT11 has a source connected to the power supply Vdd and a drain connected to the sources of the PMOS transistors PT12 and PT13.

The drain of the PMOS transistor PT12 is connected to the non-output line L11, and the non-output line L11 is connected to the ground GND.

The drain of the PMOS transistor PT13 is connected to the output line L12. The output line L12 is connected to one end of the output resistor R11, and the other end of the output resistor R11 is connected to the ground GND.

In the basic current source cells 11-1 to 11-n, the gates of the PMOS transistors PT11 are connected in common to the bias line LVB11 which is a supply line of a bias voltage Vbias-h of the sample and hold circuit section 13.

Moreover, the gates of the PMOS transistors PT12 are connected to a supply line of a digital signal Qin, and the gates of the PMOS transistors PT13 are connected to a supply line of a signal xQin which is an opposite-phase signal of the digital signal Qin.

The analog output section 11 adds current outputs of selected basic current source cells to generate an output current Iout.

The analog output section 11 converts the output current Iout to a voltage signal using the output resistor R11 serving as a current-to-voltage converter and outputs this analog signal through the output line L12 as a signal Vout.

The current control section 12 is formed by a current source I11 and a diode-connected PMOS transistor PT14 whose gate and drain are short-circuited.

The PMOS transistor PT14 has a source connected to the power supply Vdd and the gate and drain connected together and connected to the current source I11 and the bias line LVB12. Moreover, the current source I11 is connected to the ground GND.

The current control section 12 having such a configuration generates a predetermined bias voltage Vbias-s by controlling the amount of current flowing into the current source I11 with a control signal CTL, for example.

Moreover, the current control section 12 is configured to be capable of controlling the amount of current flowing into the basic current source cells 11-1 to 11-n via the sample and hold circuit section 13 with the generated bias voltage Vbias-s.

The PMOS transistors PT11 serving as the current sources in the basic current source cells 11-1 to 11-n are current-mirror connected to the PMOS transistor PT14 of the current control section 12 through the bias lines LVB11 and LVB12 via the sample and hold circuit 13.

The predetermined bias voltage Vbias generated by the current control section 12 is also applied to the PMOS transistors PT11 in the basic current source cells 11-1 to 11-n, so that a current I1 flowing in the current control section 12 is mirror-multiplied by an amount exactly equal to a current-mirror ratio and output.

The sample and hold circuit section 13 has a PMOS transistor PT15 serving as a switching transistor (sampling switch), a hold capacitor C11, and a PMOS transistor PT16 for feedthrough cancellation.

The PMOS transistor PT15 has source and drain connected to the bias lines LVB11 and LVB12 and a gate connected to a supply terminal TSHSW of a control signal SHSW.

The PMOS transistor PT15 serving as the switching transistor is turned on and off in accordance with the control signal SHSW, thus selectively transferring the bias voltage Vbias-s of the bias line LVB12 towards the bias line LVB11.

The hold capacitor C11 has one end (first electrode) connected to the bias line LVB11 and the other end (second electrode) connected to the ground GND.

The hold capacitor C11 stores an amount of electric charge corresponding to the bias voltage transferred to the bias line LVB11.

The PMOS transistor PT16 has source and drain connected together and connected to the bias line LVB11 and a gate connected to a supply terminal TFTCS of a control signal FTCS.

The PMOS transistor PT16 is provided to suppress the influence of feedthrough (FT) or charge-injection (CI) caused by switching.

The control signal SHSW that controls the PMOS transistor PT15 serving as the switching transistor and the control signal FTCS that controls the PMOS transistor PT16 are supplied in opposite phases.

The reason for inputting the control signal SHSW and the control signal FTCS in opposite phases is to reduce the influence of FT or CI in the PMOS transistor PT15 serving as the switching transistor.

[Driving of Sample and Hold Circuit]

Next, the operation of the DA converter 10 according to the first embodiment will be described based on the driving of the sample and hold circuit section 13.

Figure 4:
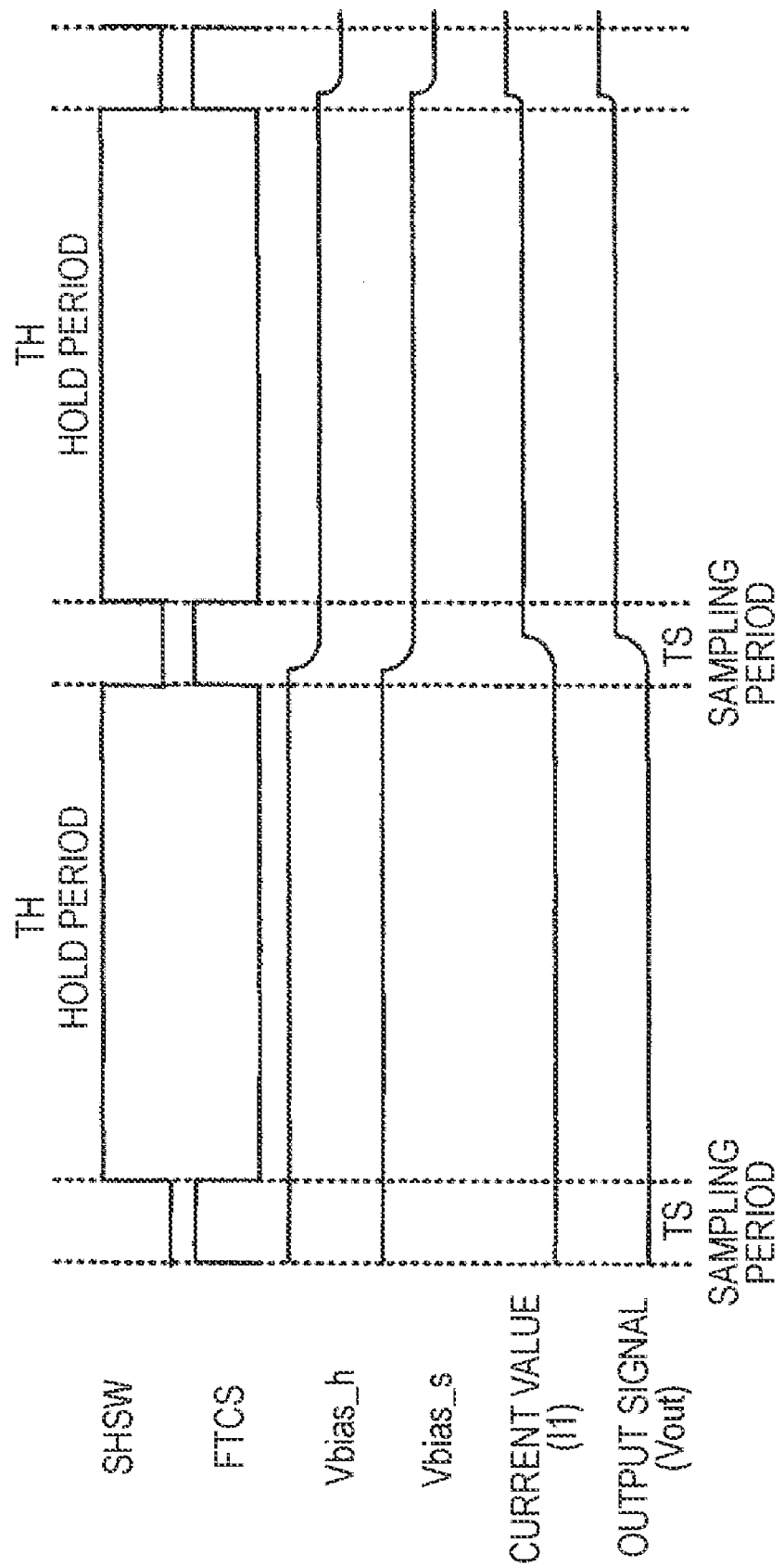
FIG. 4 is a timing chart showing the operation of a sample and hold circuit section of the DA converter according to the first embodiment.

FIG. 4 is a timing chart showing the operation of a sample and hold circuit section of the DA converter according to the first embodiment.

[Sampling Period]

In a sampling period TS, the switching control signal SHSW is set to a low level, and the PMOS transistor PT15 serving as the switching transistor is controlled to be in an ON state.

In the sampling period TS, a predetermined bias voltage Vbias is applied to the gates of the PMOS transistors PT11 of the basic current source cells 11-1 to 11-n.

Therefore, a current which is mirror-multiple of the current flowing in the current source I11 of the current control section 12 flows in the basic current source cells 11-1 to 11-n.

At that time, the control signal FTCS for FT cancellation is set to a low level.

[Hold Period]

When the predetermined bias voltage Vbias-s is held constant, the switching control signal SHSW is switched to a high level. In this way, the PMOS transistor PT15 serving as the switching transistor is turned off.

At that time, the gate of the diode-connected PMOS transistor PT14 in the current control section 12 is disconnected from the gates of the PMOS transistors PT11 of the basic current source cells 11-1 to 11-n. Moreover, the gate voltages of the PMOS transistors PT11 are in a floating state while holding the bias voltage Vbias-s.

Since the bias voltage Vbias-h will not change during the hold period once sampling is performed, the value of the current flowing in the basic current source cells 11-1 to 11-n will not change.

Moreover, the FT cancellation control signal FTCS is set to a high level opposite to the switching control signal SHSW, and thus, the influence of FT or CI can be suppressed as much as possible.

The sample and hold operation may be performed during a predetermined period or may be performed when the value of the current flowing in the current control section 12 is changed, and thus the value of the bias voltage Vbias-s is changed.

The value of the bias voltage Vbias can be held when the output signal Vout of the current-controlled DA converter 10 is constant.

In this way, it is possible to prevent thermal noise or 1/f noise generated in a preceding stage of the circuit of the current-controlled DA converter 10, e.g., the current control section 12, the current source I11, and the like, from being superimposed on the output signal.

<2. Second Embodiment>

[Second Exemplary Configuration of DA Converter]

Figure 5:
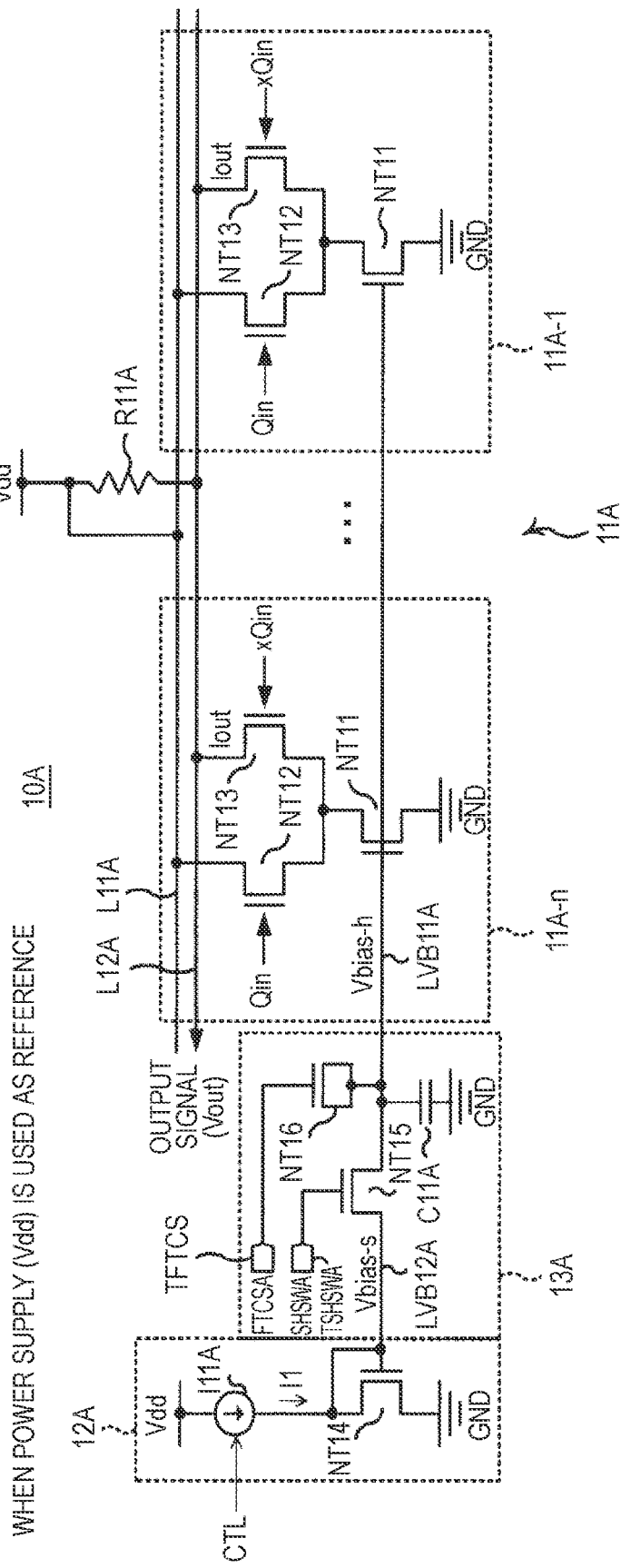
FIG. 5 is a circuit diagram showing an exemplary configuration of a DA converter according to a second embodiment of the present invention.

FIG. 5 is a circuit diagram showing an exemplary configuration of a DA converter according to the second embodiment of the present invention.

This DA converter 10A according to the second embodiment has an analog output section 11A, a current control section 12A, a sample and hold circuit section 13A, a first bias line LVB11A, and a second bias line LVB12A.

The analog output section 11A has a function of generating an output current corresponding to the value of a digital signal in response to a bias voltage and outputting an analog signal which is obtained from the output current by current-to-voltage conversion.

The analog output section 11A has basic current source cells 11A-1 to 11A-n, a non-output line L11A, an output line L12A, and an output resistor R11A.

The DA converter 10A has a sample and hold circuit section 13A that samples and holds a bias voltage Vbias of the basic current source cells 11A-1 to 11A-n of the analog output section 11A.

The DA converter 10A shows a case where the power supply potential Vdd is used as a reference potential.

The basic current source cells (C) 11A-1 to 11A-n have a common configuration.

That is to say, each of the basic current source cells 11A (11A-1 to 11A-n) has NMOS transistors NT11 to NT13.

In each basic current source cell 11A (11A-1 to 11A-n), the NMOS transistor NT11 has a source connected to the ground GND and a drain connected to the sources of the NMOS transistors NT12 and NT13.

The drain of the NMOS transistor NT12 is connected to the non-output line L11A, and the non-output line L11A is connected to the power supply Vdd.

The drain of the NMOS transistor NT13 is connected to the output line L12A. The output line L12A is connected to one end of the output resistor R11A, and the other end of the output resistor R11A is connected to the power supply Vdd.

In the basic current source cells 11A-1 to 11A-n, the gates of the NMOS transistors NT11 are connected in common to the bias line LVB11A which is a supply line of a bias voltage Vbias-h of the sample and hold circuit section 13A.

Moreover, the gates of the NMOS transistors NT12 are connected to a supply line of a digital signal Qin, and the gates of the NMOS transistors NT13 are connected to a supply line of a signal xQin which is an opposite-phase signal of the digital signal Qin.

The analog output section 11A adds current outputs of selected basic current source cells to generate an output current Iout.

The analog output section 11A converts the output current Iout to a voltage signal using the output resistor R11A serving as a current-to-voltage converter and outputs this analog signal through the output line L12A as a signal Vout.

The current control section 12A is formed by a current source I11A and a diode-connected NMOS transistor NT14 whose gate and drain are short-circuited.

The NMOS transistor NT14 has a source connected to the ground GND and the gate and drain connected together and connected to the current source I11A and the bias line LVB12A. Moreover, the current source I11A is connected to the power supply Vdd.

The current control section 12A having such a configuration generates a predetermined bias voltage Vbias-s by controlling the amount of current flowing into the current source I11A with a control signal CTL, for example.

Moreover, the current control section 12A is configured to be capable of controlling the amount of current flowing into the basic current source cells 11A-1 to 11A-n via the sample and hold circuit section 13A with the generated bias voltage Vbias-s.

The NMOS transistors NT11 serving as the current sources in the basic current source cells 11A-1 to 11A-n are current-mirror connected to the NMOS transistor NT14 of the current control section 12A through the bias lines LVB11A and LVB12A via the sample and hold circuit 13A.

The predetermined bias voltage Vbias generated by the current control section 12A is also applied to the NMOS transistors NT11 in the basic current source cells 11A-1 to 11A-n, so that a current I1 flowing in the current control section 12A is mirror-multiplied by an amount exactly equal to a current-mirror ratio and output.

The sample and hold circuit section 13A has an NMOS transistor NT15 serving as a switching transistor (sampling switch), a hold capacitor C11A, and an NMOS transistor NT16 for feedthrough cancellation.

The NMOS transistor NT15 has source and drain connected to the bias lines LVB11A and LVB12A and a gate connected to a supply terminal TSHSWA of a control signal SHSWA.

The NMOS transistor NT15 serving as the switching transistor is turned on and off in accordance with the control signal SHSWA, thus selectively transferring the bias voltage Vbias-s of the bias line LVB12A towards the bias line LVB11A.

The hold capacitor C11A has one end (first electrode) connected to the bias line LVB11A and the other end (second electrode) connected to the ground GND.

The hold capacitor C11A stores an amount of electric charge corresponding to the bias voltage transferred to the bias line LVB11A.

The NMOS transistor NT16 has source and drain connected together and connected to the bias line LVB11A and a gate connected to a supply terminal TFTCSA of a control signal FTCSA.

The NMOS transistor NT16 is provided to suppress the influence of feedthrough (FT) or charge-injection (CI) caused by switching.

The control signal SHSWA that controls the NMOS transistor NT15 serving as the switching transistor and the control signal FTCSA that controls the NMOS transistor NT16 are supplied in opposite phases.

The reason for inputting the control signal SHSWA and the control signal FTCSA in opposite phases is to reduce the influence of FT or CI in the NMOS transistor NT15 serving as the switching transistor.

[Driving of Sample and Hold Circuit]

Next, the operation of the DA converter 10A according to the second embodiment will be described based on the driving of the sample and hold circuit section 13A.

Figure 6:
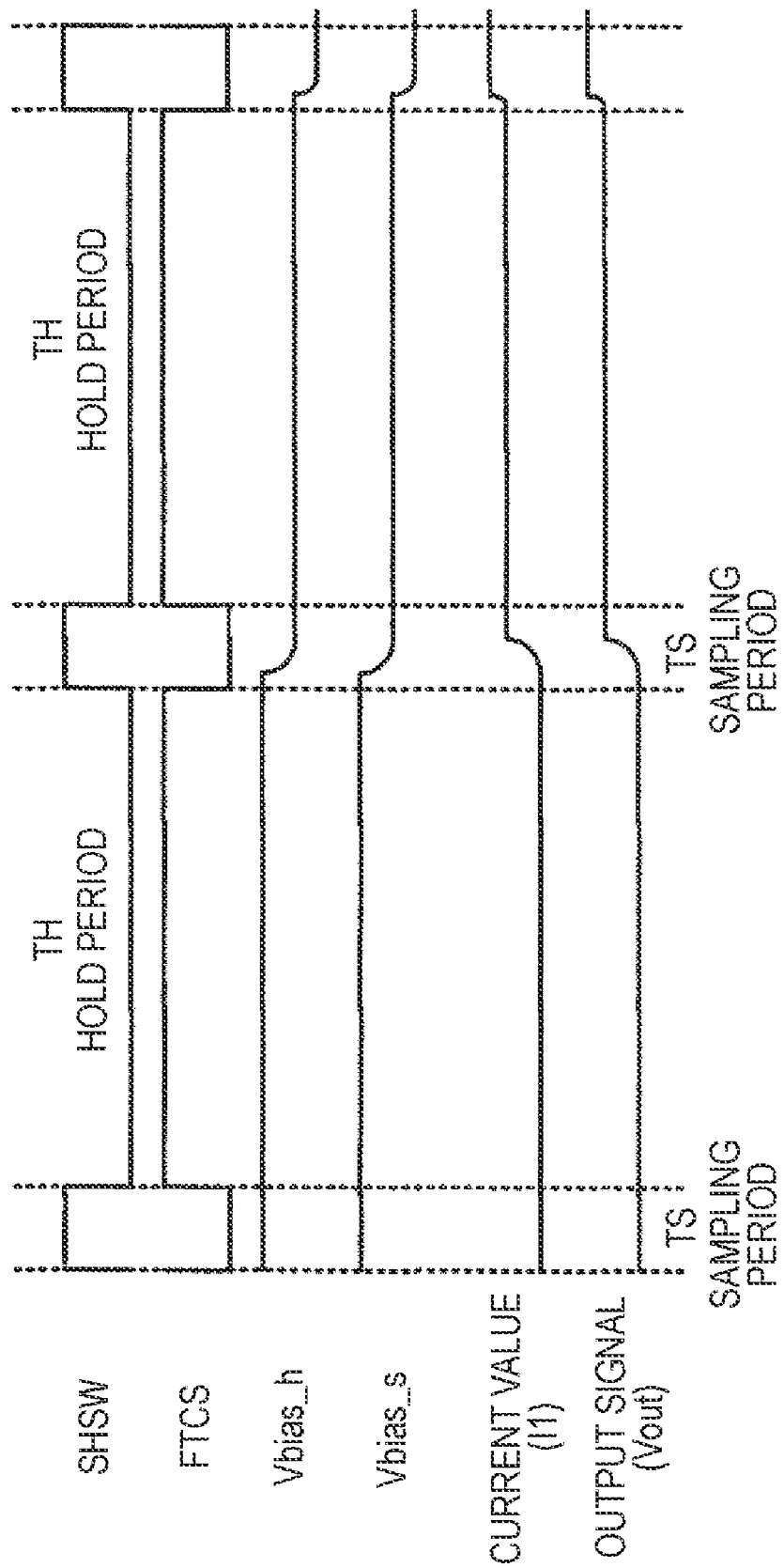
FIG. 6 is a timing chart showing the operation of a sample and hold circuit section of the DA converter according to the second embodiment.

FIG. 6 is a timing chart showing the operation of a sample and hold circuit section of the DA converter according to the second embodiment.

[Sampling Period]

In a sampling period TS, the switching control signal SHSWA is set to a high level, and the NMOS transistor NT15 serving as the switching transistor is controlled to be in an ON state.

In the sampling period TS, a predetermined bias voltage Vbias is applied to the gates of the NMOS transistors NT11 of the basic current source cells 11A-1 to 11A-n.

Therefore, a current which is a mirror-multiple of the current flowing in the current source I11A of the current control section 12A flows in the basic current source cells 11A-1 to 11A-n.

At that time, the control signal FTCSA for FT cancellation is set to a low level.

[Hold Period]

When the predetermined bias voltage Vbias-s is held constant, the switching control signal SHSWA is switched to a low level. In this way, the NMOS transistor NT15 serving as the switching transistor is turned off.

At that time, the gate of the diode-connected NMOS transistor NT14 in the current control section 12A is disconnected from the gates of the NMOS transistors NT11 of the basic current source cells 11A-1 to 11A-n. Moreover, the gate voltages of the NMOS transistors NT11 are in a floating state while holding the bias voltage Vbias-s.

Since the bias voltage Vbias-h will not change during the hold period once sampling is performed, the value of the current flowing in the basic current source cell 11A-1 to 11A-n will not change.

Moreover, the FT cancellation control signal FTCSA is set to a high level opposite to the switching control signal SHSWA, and thus, the influence of FT or CI can be suppressed as much as possible.

The sample and hold operation may be performed during a predetermined period or may be performed when the value of the current flowing in the current control section 12A is changed, and thus the value of the bias voltage Vbias-s is changed.

The value of the bias voltage Vbias can be held when the output signal Vout of the current-controlled DA converter 10A is constant.

In this way, it is possible to prevent thermal noise or 1/f noise generated in a preceding stage of the circuit of the current-controlled DA converter 10A, e.g., the current control section 12A, the current source I11A, and the like, from being superimposed on the output signal.

Hereinabove, the configuration and function of the DA converter 10 where the power supply potential Vdd is used as the reference potential and the DA converter 10A where the ground potential GND is used as the reference potential have been described.

In the section below, the reduction of output signal noise by the sample and hold circuit in the DA converter 10 shown in FIG. 3 where the ground potential GND is used as the reference potential will be discussed.

[Reduction of Output Signal Noise by Sample and Hold Circuit]

Figure 7:
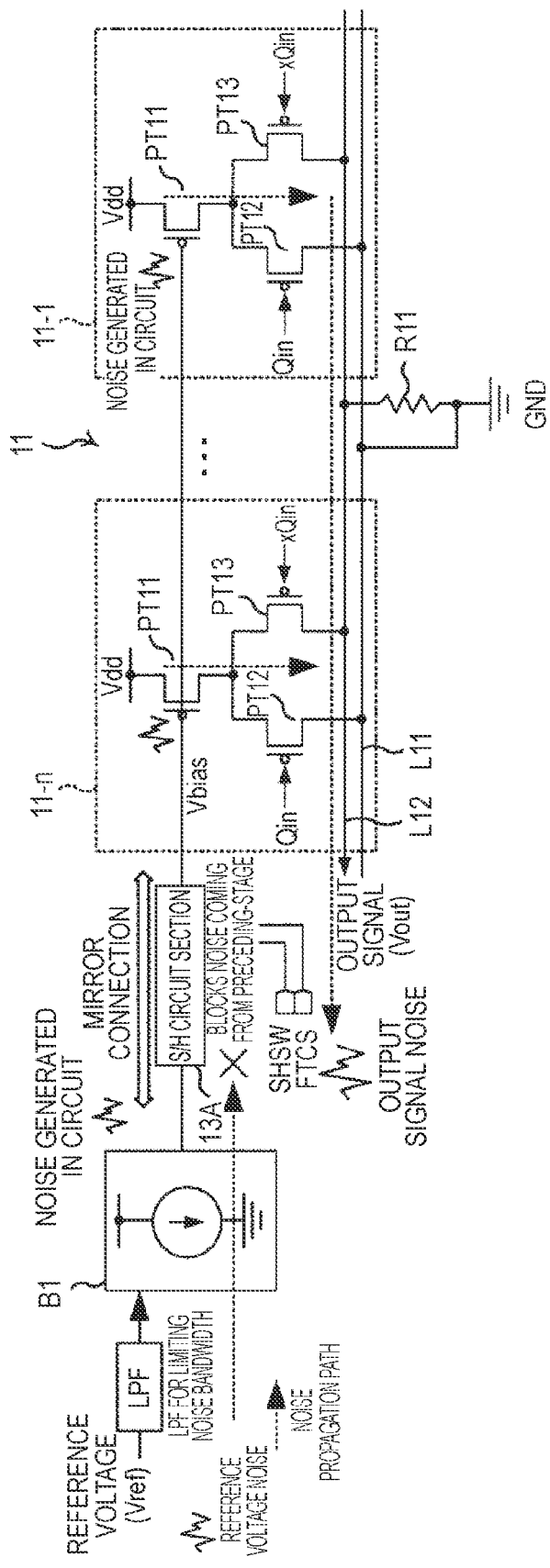
FIG. 7 is a diagram showing a noise propagation state in the current-controlled DA converter shown in FIG. 3 having the sample and hold circuit.

FIG. 7 is a diagram showing a noise propagation state in the current-controlled DA converter shown in FIG. 3 having the sample and hold circuit.

The thermal noise or I/F noise appearing in the reference voltage Vref or generated in the reference current generating section is deprived of its frequency component once it is sampled by the sample and hold circuit 13A and is superimposed on the held voltage as a simple offset voltage.

This is because the noise is integrated over the whole frequency range by sampling as below.

$$V_n^2 = \int_0^\infty Vnd(f)df \ [V^2] \quad (1)$$

Here, Vnd(f) represents a noise density of the thermal noise or 1/f noise of a transistor. The noise density of the thermal noise or 1/f noise is given by the expression below.

$$Vnd^2(f) = 4kT \times \gamma \times 1/gm \times \Delta f \ [V^2/\text{Hz}] \ldots \text{For Thermal Noise} \quad (2)$$

$$Vnd^2(f) = K/(Cox \times W \times L \times \Delta f) \ [V^2/\text{Hz}] \ldots \text{For } 1/f \text{ Noise} \quad (3)$$

Here, k is the Boltzmann's constant, T is the absolute temperature, and γ is a fitting parameter determined by a gate length of a transistor. Moreover, Gm is a conductance of a transistor, K is a process-dependent parameter, Cox is a capacitance of an oxide film of a transistor, W is a gate width, L is a gate length, and Δf is a unit frequency.

Since the thermal noise or 1/f noise becomes a simple offset voltage by being deprived of its frequency component when the bias voltage Vbias is held, the noise can be removed easily by the signal processing of correlated double sample (CDS) or the like.

That is to say, it is possible to nullify the influence of the noise generated in the preceding stage of the sample and hold circuit section 13A on the output signal Vout.

It should be noted that the reduction of the output signal noise by the sample and hold circuit can be realized in the DA converter 10A of the second embodiment.

<3. Third Embodiment>

[Third Exemplary Configuration of DA Converter]

Figure 8:
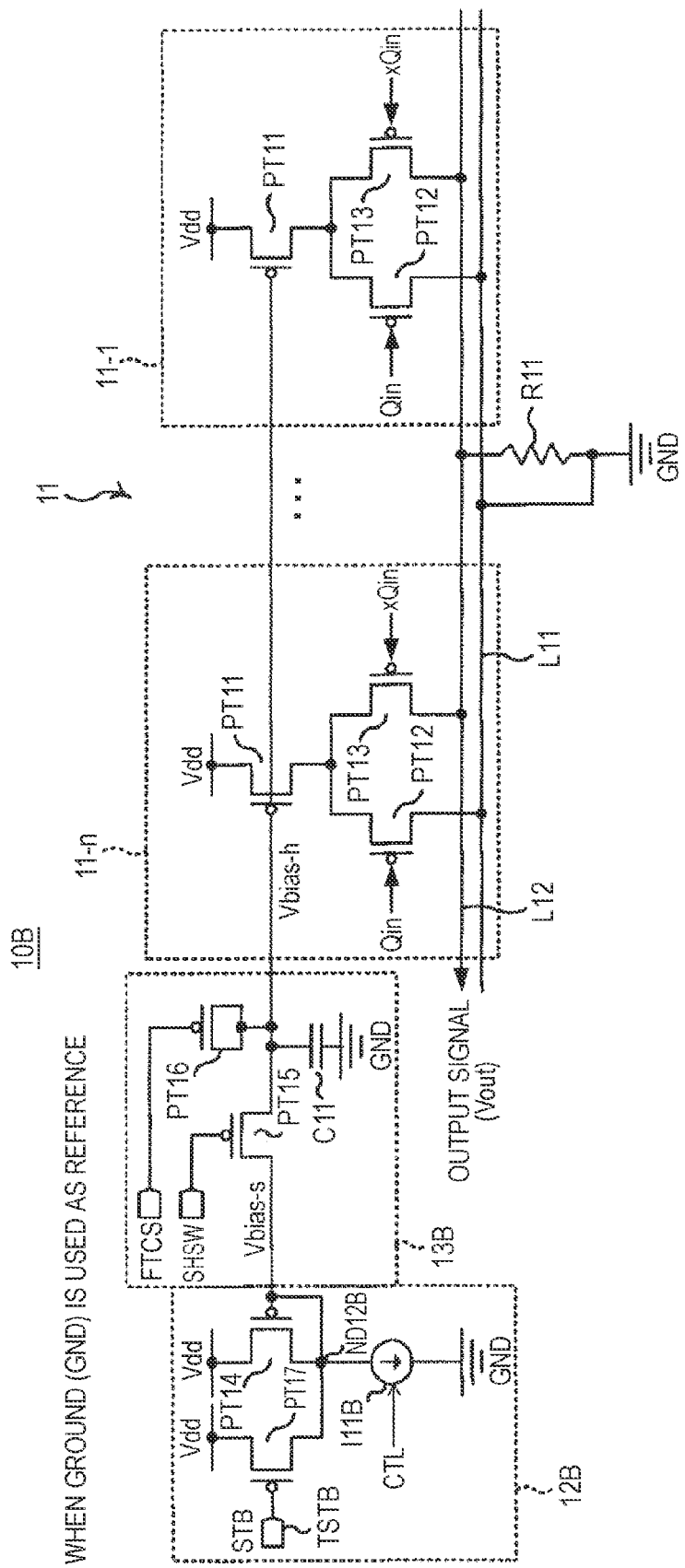
FIG. 8 is a circuit diagram showing an exemplary configuration of a DA converter according to a third embodiment of the present invention.

FIG. 8 is a circuit diagram showing an exemplary configuration of a DA converter according to the third embodiment of the present invention.

This DA converter 10B according to the third embodiment is different from the DA converter 10 according to the first embodiment in the following respects.

In the DA converter 10B according to the third embodiment, a current control section 12B stops supply of the current of a current source I11B that generates a bias voltage Vbias-s during the hold period of a sample and hold circuit section 13B, thus achieving low power consumption.

Specifically, in the current control section 12B, a PMOS transistor PT17 is connected in parallel to the PMOS transistor PT14 between the power supply Vdd and a node ND12B which is a connection point of the PMOS transistor PT14 and a current source I11B.

That is to say, the PMOS transistor PT17 has a drain connected to the node ND12B, a source connected to the power supply Vdd, and a gate connected to a supply terminal TSTB of a current supply control signal STB which is set to a high level during the hold period.

In the DA converter 10B, during the hold period, the current supply control signal STB in the low level is supplied, and the PMOS transistor PT17 is held in an ON state. As a result, electric charges are stored in the node ND12B, and the drain and gate of the PMOS transistor PT14 are in the power supply Vdd level, whereby supply of current by the current source I11B is stopped.

Moreover, at that time, the current source I11B is controlled so as to stop current supply by a control signal CTL.
[Driving of Sample and Hold Circuit]

Next, the operation of the DA converter 10B according to the third embodiment will be described based on the driving of the sample and hold circuit section 13B.

Figure 9:
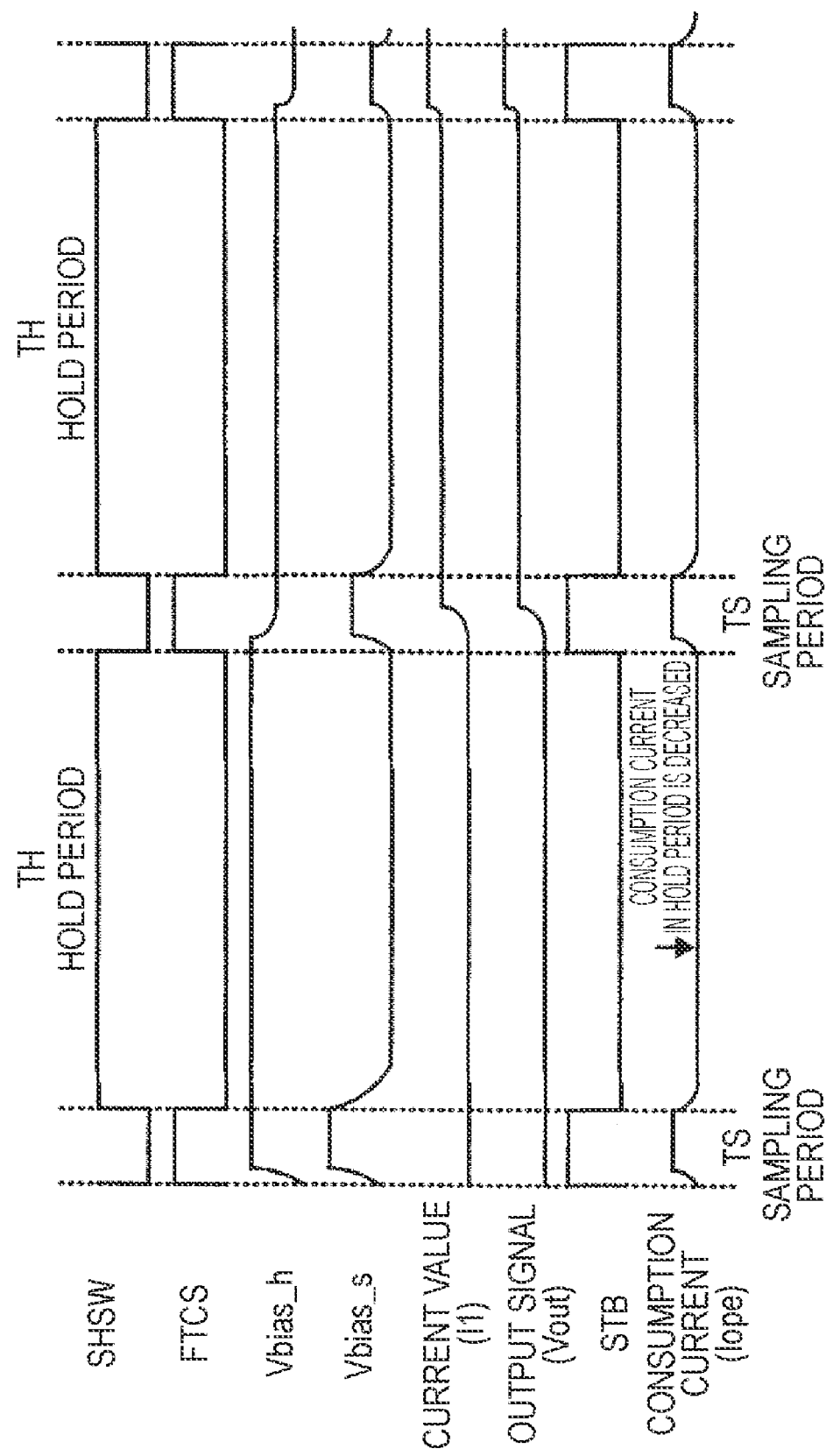
FIG. 9 is a timing chart showing the operation of a sample and hold circuit section of the DA converter according to the third embodiment.

FIG. 9 is a timing chart showing the operation of a sample and hold circuit section of the DA converter according to the third embodiment.
[Sampling Period]

In a sampling period TS, the switching control signal SHSW is set to a low level, and the PMOS transistor PT15 serving as the switching transistor is controlled to be in an ON state.

In the sampling period TS, since the current supply control signal STB is set to the high level, the PMOS transistor PT17 is held in an OFF state.

As a result, in the current control section 12B, current is supplied from the current source I11B, and a predetermined bias voltage Vbias-s is generated.

At that time, the control signal FTCS for FT cancellation is set to a high level.
[Hold Period]

When the predetermined bias voltage Vbias-s is held constant, the switching control signal SHSW is switched to a high level. In this way, the PMOS transistor PT15 serving as the switching transistor is turned off.

At that time, the gate of the diode-connected PMOS transistor PT14 in the current control section 12B is disconnected from the gates of the PMOS transistors PT11 of the basic current source cells 11-1 to 11-$n$. Moreover, the gate voltages of the PMOS transistors PT11 are in a floating state while holding the bias voltage Vbias-h.

When the bias voltage Vbias-h is held, the current supply control signal STB is set to a low level. In this way, the PMOS transistor PT17 enters an ON state, and the current supply of the current source I11B is cut off. At that time, the current source I11B is controlled so as to stop current supply by the control signal CTL.

The bias voltage Vbias-s generated by the current control section 12B is changed to the power supply Vdd level since the current supply is cut off. However, since the bias voltage Vbias-h held in the sample and hold circuit section 13B maintains the same value as during the sampling period TS, the value of the current flowing in the basic current source cells 11-1 to 11-$n$ will not change.

Moreover, the FT cancellation control signal FTCS is set to a low level opposite to the switching control signal SHSW, and thus, the influence of FT or CI can be suppressed as much as possible.

By the above-described driving, the amount of current consumed by the current control section 12B during the hold period is reduced.

As seen above, according to the third embodiment, when the predetermined bias voltage Vbias-h is held in the sample and hold circuit section 13B, it is not necessary to generate the bias voltage Vbias-s during the hold period. For this reason, by stopping the circuit that generates the bias voltage Vbias-s, it is possible to reduce the consumption current.

<4. Fourth Embodiment>
[Fourth Exemplary Configuration of DA Converter]

Figure 10:
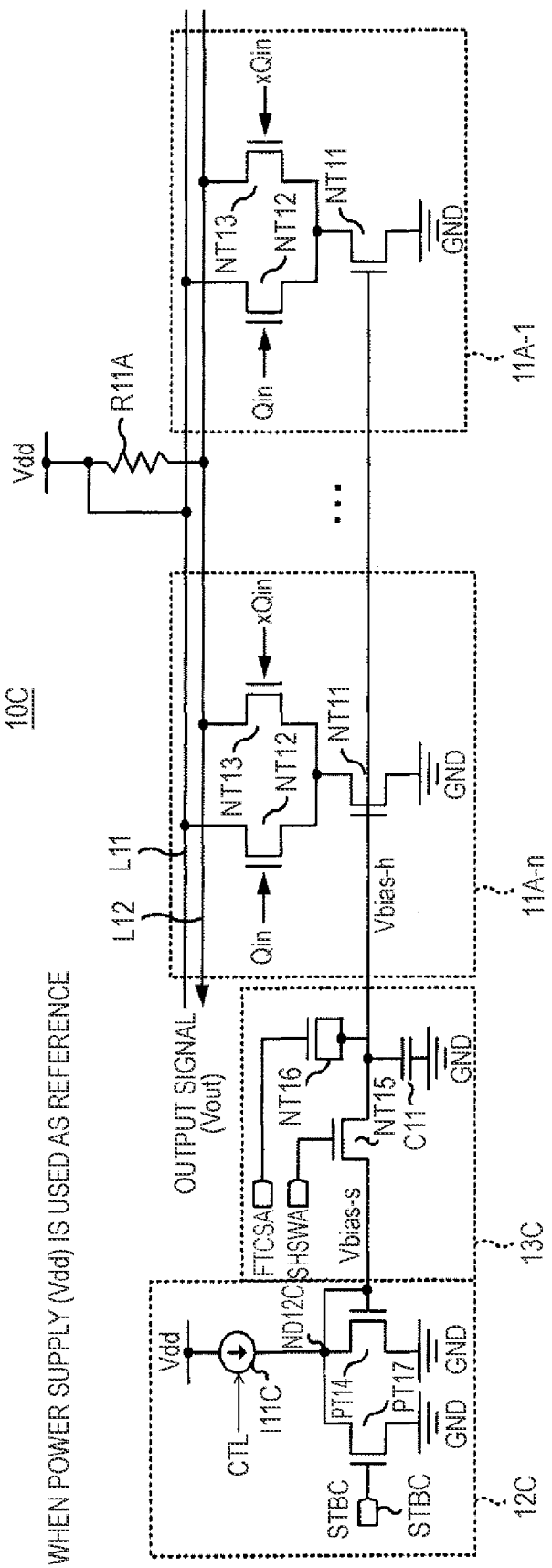
FIG. 10 is a circuit diagram showing an exemplary configuration of a DA converter according to a fourth embodiment of the present invention.

FIG. 10 is a circuit diagram showing an exemplary configuration of a DA converter according to the fourth embodiment of the present invention.

This DA converter 10C according to the fourth embodiment is different from the DA converter 10A according to the second embodiment in the following respects.

In the DA converter 10C according to the fourth embodiment, a current control section 12C stops supply of the current of a current source I11C that generates a bias voltage Vbias-s during the hold period of a sample and hold circuit section 13C, thus achieving low power consumption.

Specifically, in the current control section 12C, an NMOS transistor NT17 is connected in parallel to the NMOS transistor NT14 between the ground GND and a node ND12C which is a connection point of the NMOS transistor NT14 and a current source I11C.

That is to say, the NMOS transistor NT17 has a drain connected to the node ND12C, a source connected to the ground GND, and a gate connected to a supply terminal TSTBC of a current supply control signal STBC which is set to a high level during the hold period.

In the DA converter 10C, during the hold period, the current supply control signal STBC in the high level is supplied, and the NMOS transistor NT17 is held in an ON state. As a result, electric charges in the node ND12C are discharged, and the drain and gate of the NMOS transistor NT14 are in the ground GND level, whereby supply of current by the current source I11C is stopped.

Moreover, at that time, the current source I11C is controlled so as to stop current supply by a control signal CTL.
[Driving of Sample and Hold Circuit]

Next, the operation of the DA converter 10C according to the fourth embodiment will be described based on the driving of the sample and hold circuit section 13C.

Figure 11:
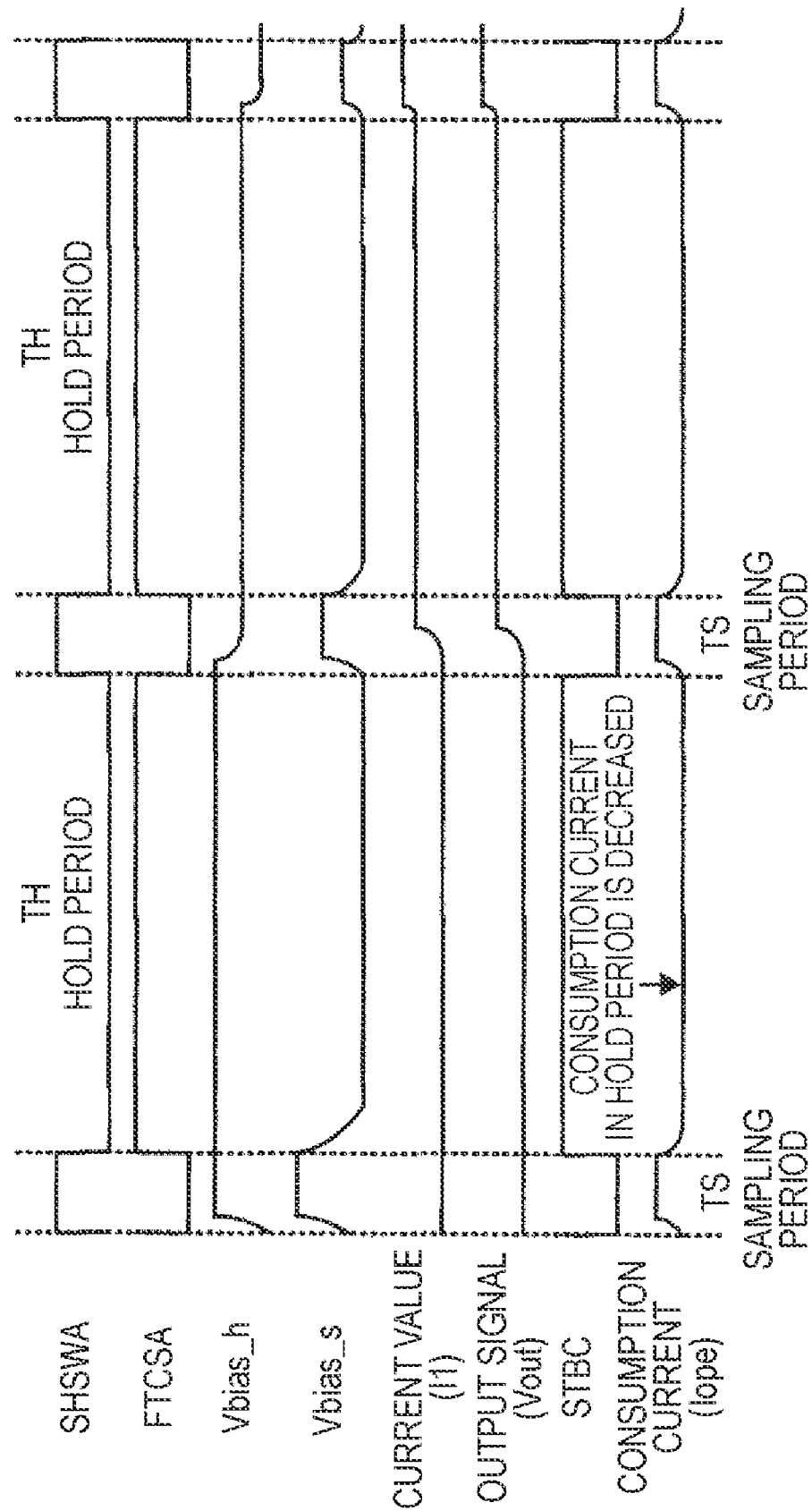
FIG. 11 is a timing chart showing the operation of a sample and hold circuit section of the DA converter according to the fourth embodiment.

FIG. 11 is a timing chart showing the operation of a sample and hold circuit section of the DA converter according to the fourth embodiment.
[Sampling Period]

In a sampling period TS, the switching control signal SHSWA is set to a high level, and the NMOS transistor NT15 serving as the switching transistor is controlled to be in an ON state.

In the sampling period TS, since the current supply control signal STBC is set to the low level, the NMOS transistor NT17 is held in an OFF state.

As a result, in the current control section 12C, current is supplied from the current source I11C, and a predetermined bias voltage Vbias-s is generated.

At that time, the control signal FTCSA for FT cancellation is set to a low level.

[Hold Period]

When the predetermined bias voltage Vbias-s is held constant, the switching control signal SHSWA is switched to a low level. In this way, the NMOS transistor NT15 serving as the switching transistor is turned off.

At that time, the gate of the diode-connected NMOS transistor NT14 in the current control section 12C is disconnected from the gates of the NMOS transistors NT11 of the basic current source cells 11A-1 to 11A-n. Moreover, the gate voltages of the NMOS transistors NT11 are in a floating state while holding the bias voltage Vbias-h.

When the bias voltage Vbias-h is held, the current supply control signal STBC is set to a high level. In this way, the NMOS transistor NT17 enters an ON state, and the current supply of the current source I11C is cut off. At that time, the current source I11C is controlled so as to stop current supply by the control signal CTL.

The bias voltage Vbias-s generated by the current control section 12C is changed to the ground GND level since the current supply is cut off. However, since the bias voltage Vbias-h held in the sample and hold circuit section 13C maintains the same value as during the sampling period TS, the value of the current flowing in the basic current source cells 11A-1 to 11A-n will not change.

Moreover, the FT cancellation control signal FTCSA is set to a high level opposite to the switching control signal SHSWA, and thus, the influence of FT or CI can be suppressed as much as possible.

By the above-described driving, the amount of current consumed by the current control section 12C during the hold period is reduced.

As seen above, according to the fourth embodiment, when the predetermined bias voltage Vbias-h is held in the sample and hold circuit section 13C, it is not necessary to generate the bias voltage Vbias-s during the hold period. For this reason, by stopping the circuit that generates the bias voltage Vbias-s, it is possible to reduce the consumption current.

Hereinabove, the DA converters 10, 10A, 10B, and 10C according to the first to fourth embodiments have been described.

According to the present embodiments, the current-controlled DA converter employs the sample and hold circuit that samples and holds the predetermined bias voltage Vbias that controls the current value of the basic current source cell.

Therefore, it is possible to nullify the influence of the thermal noise and 1/f noise generated in the preceding circuit of the DA converter, e.g., the current control section, the reference current generating section, or the reference voltage Vref, on the output signal Vout, and to thus reduce noise in the output signal Vout.

Since the influence of the noise in the reference voltage Vref on the output signal Vout can be reduced to the minimum extent, it is not necessary to provide an LPF (Low-Pass Filter) that limits the bandwidth of noise included in the reference voltage Vref, thus reducing the number of circuit components.

Since the bias voltage Vbias is held by the hold capacitor C11 during the operation of the DA converter, it is not necessary to generate the bias voltage Vbias in the current control section 12. For this reason, by cutting of the supply of current, which is normally allowed to flow into the current control section 12, during the hold period of the bias voltage Vbias, it is possible to achieve lower power consumption in circuits or devices than those of the related art.

The DA converters 10, 10A to 10C having such advantages can be applied to a DA converter for a solid-state imaging device.

An example of application of the DA converters of the present embodiments include, but not particularly limited to, a CMOS image sensor employing a column-parallel AD converter.

<5. Fifth Embodiment>

[Exemplary Overall Configuration of Solid-State Imaging Device]

Figure 12:
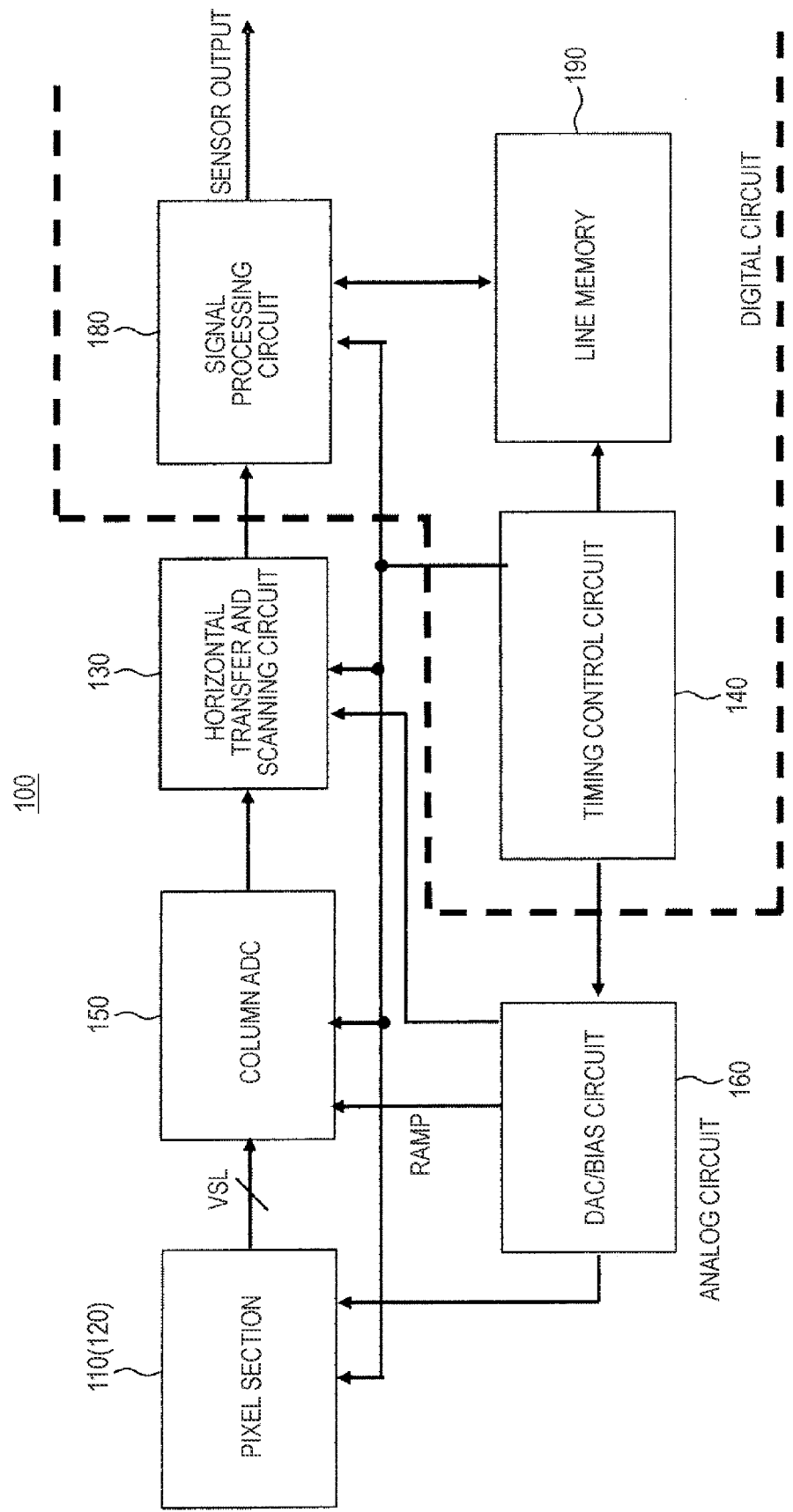
FIG. 12 is a block diagram showing an exemplary configuration of a solid-state imaging device (CMOS image sensor) employing a column-parallel ADC according to the embodiment of the present invention.

FIG. 12 is a block diagram showing an exemplary configuration of a solid-state imaging device (CMOS image sensor) employing a column-parallel ADC according to the fifth embodiment of the present invention.

Figure 13:
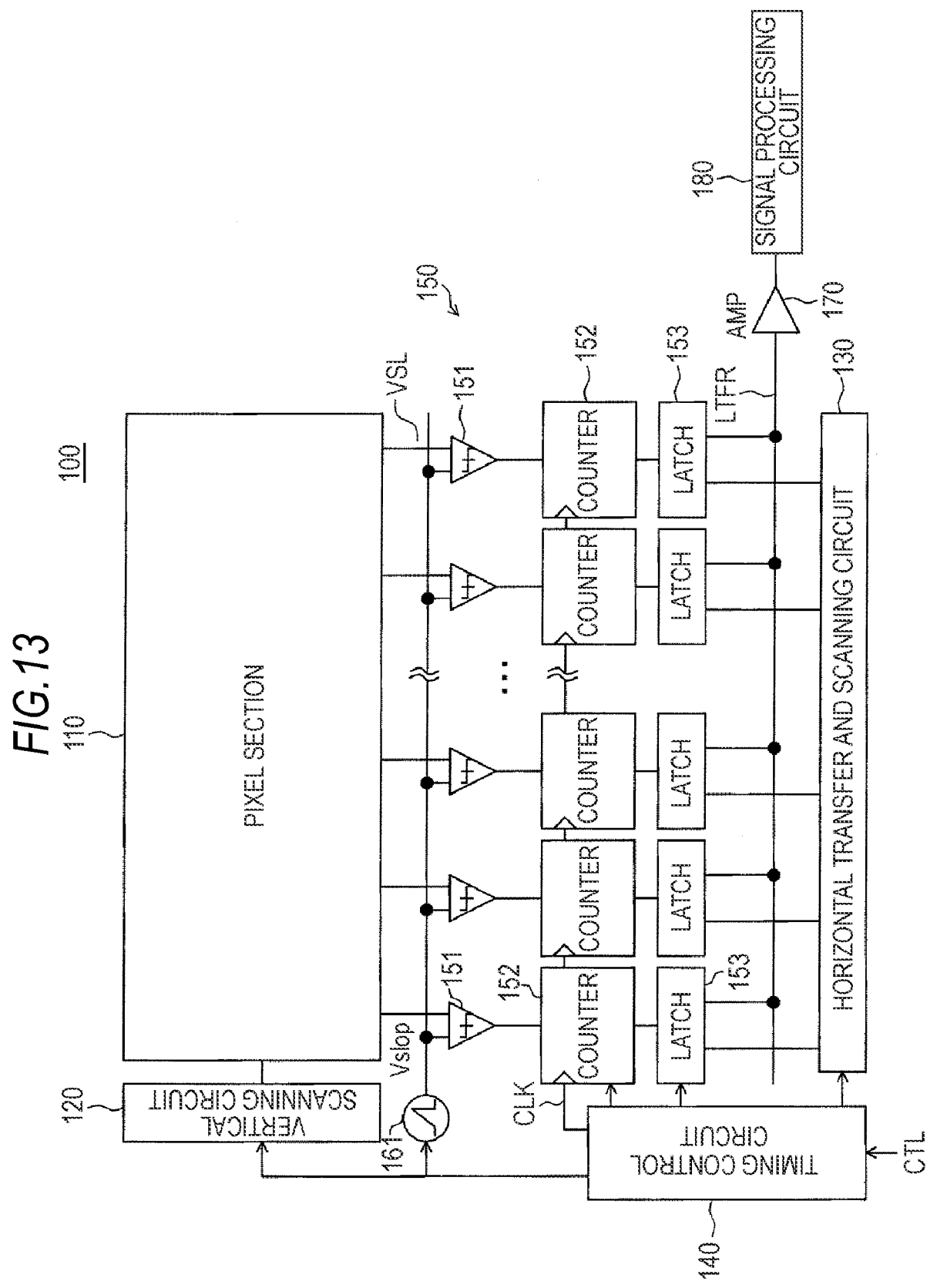

FIG. 13 is a block diagram showing more specifically an ADC group of the column-parallel ADC employed by the solid-state imaging device (CMOS image sensor) shown in FIG. 12.

As shown in FIGS. 12 and 13, this solid-state imaging device 100 has a pixel section 110 serving as an imaging section, a vertical scanning circuit 120, a horizontal transfer scanning circuit 130, a timing control circuit 140, and an AD converter group 150 serving as a pixel signal readout section.

The solid-state imaging device 100 further has a DAC and bias circuit 160 including a DA converter 161, an amplifier circuit (S/A) 170, a signal processing circuit 180, and a line memory 190.

Among these constituent elements, the pixel section 110, the vertical scanning circuit 120, the horizontal transfer scanning circuit 130, the ADC group 150, the DAC and bias circuit 160, and the amplifier circuit (S/A) 170 are configured by analog circuits.

Moreover, the timing control circuit 140, the signal processing circuit 180, and the line memory 190 are configured by digital circuits.

The pixel section 110 has a configuration in which pixels, each including a photodiode and an intra-pixel amplifier, are arranged in a matrix form.

Figure 14:
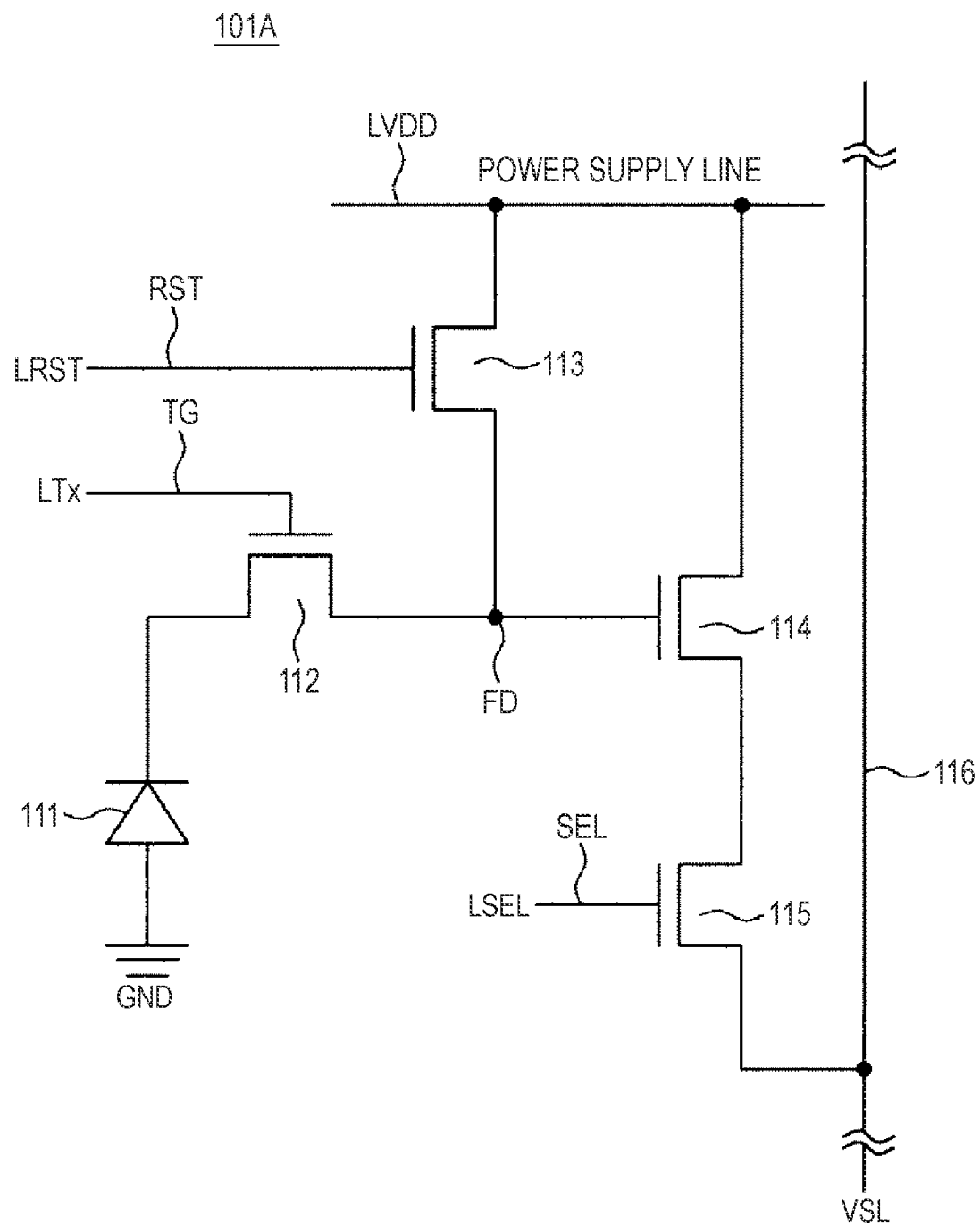
FIG. 14 is a diagram showing an example of a pixel in a CMOS image sensor, the pixel having four transistors according to the embodiment of the present invention.

FIG. 14 is a diagram showing an example of a pixel in a CMOS image sensor, the pixel having four transistors according to the embodiment of the present invention.

This pixel circuit 101A has a photodiode 111, for example, as a photoelectric conversion element.

The pixel circuit 101A has the photodiode 111 serving as one photoelectric conversion element.

The pixel circuit 101A has four transistors as active elements for one photodiode 111. The four transistors include a transfer transistor 112 serving as a transfer element, a reset transistor 113 serving as a reset element, an amplification transistor 114, and a selection transistor 115.

The photodiode 111 photoelectrically converts an incident light into an amount of electric charges (electrons in this case) corresponding to the amount of the incident light.

The transfer transistor 112 is connected between the photodiode 111 and a floating diffusion FD serving as an output node.

Upon application of a drive signal TG to the gate (transfer gate) of the transfer transistor 112 via a transfer control line LTx, the transfer transistor 112 transfers the electrons photoelectrically converted by the photodiode 111 to the floating diffusion FD.

The reset transistor 113 is connected between a power supply line LVDD and the floating diffusion FD.

Upon application of a reset signal RST to the gate of the reset transistor 113 via a reset control line LRST, the reset transistor 113 resets the potential of the floating diffusion FD to the potential of the power supply line LVDD.

A gate of the amplification transistor 114 is connected to the floating diffusion FD. The amplification transistor 114 is connected to a vertical signal line 116 via the selection transistor 115. The amplification transistor 114 and a constant current source located outside the pixel section constitute a source follower.

When a control signal (address signal or select signal) SEL is supplied to the gate of the selection transistor 115 via a select control line LSEL, the selection transistor 115 is turned on.

When the selection transistor 115 is turned on, the amplification transistor 114 amplifies the potential of the floating diffusion FD and outputs a voltage corresponding to the amplified potential to the vertical signal line 116. The voltage output from each pixel is then output to the ADC group 150 serving as a pixel signal readout circuit via the vertical signal line 116.

These operations are simultaneously performed for pixels of one row because the respective gates of, e.g., the transfer transistor 112, the reset transistor 113, and the selection transistors 115 are connected for each row.

A set of the reset control line LRST, the transfer control line LTx, and the select control line LSEL, which are provided in the pixel section 110, is provided for each row of a pixel array.

The reset control line LRST, the transfer control line LTx, and the select control line LSEL are driven by the vertical scanning circuit 120 serving as a pixel driving section.

In the solid-state imaging device 100, the timing control circuit 140 that generates an internal clock, the vertical scanning circuit 120 that controls row addressing and row scanning, and the horizontal transfer scanning circuit 130 that controls column addressing and column scanning are arranged as control circuits for sequentially reading out signals from the pixel section 110.

The timing control circuit 140 generates timing signals necessary for signal processing by the pixel section 110, the vertical scanning circuit 120, the horizontal transfer scanning circuit 130, the AD converter group (column ADC circuits) 150, the DAC and bias circuit 160, the signal processing circuit 180, and the line memory 190.

In the pixel section 110, by performing photon accumulation and discharge using a line shutter, for example, moving or still images are photoelectrically converted in each pixel row, and an analog signal VSL is output to the ADC group.

In the ADC group 150, each ADC block (each column section) performs APGA-compatible integration ADC using a ramp signal RAMP supplied from the DA converter (DAC) 161 and digital CDS with respect to the analog output of the pixel section 110 to output a digital signal of several bits.

Figure 15:
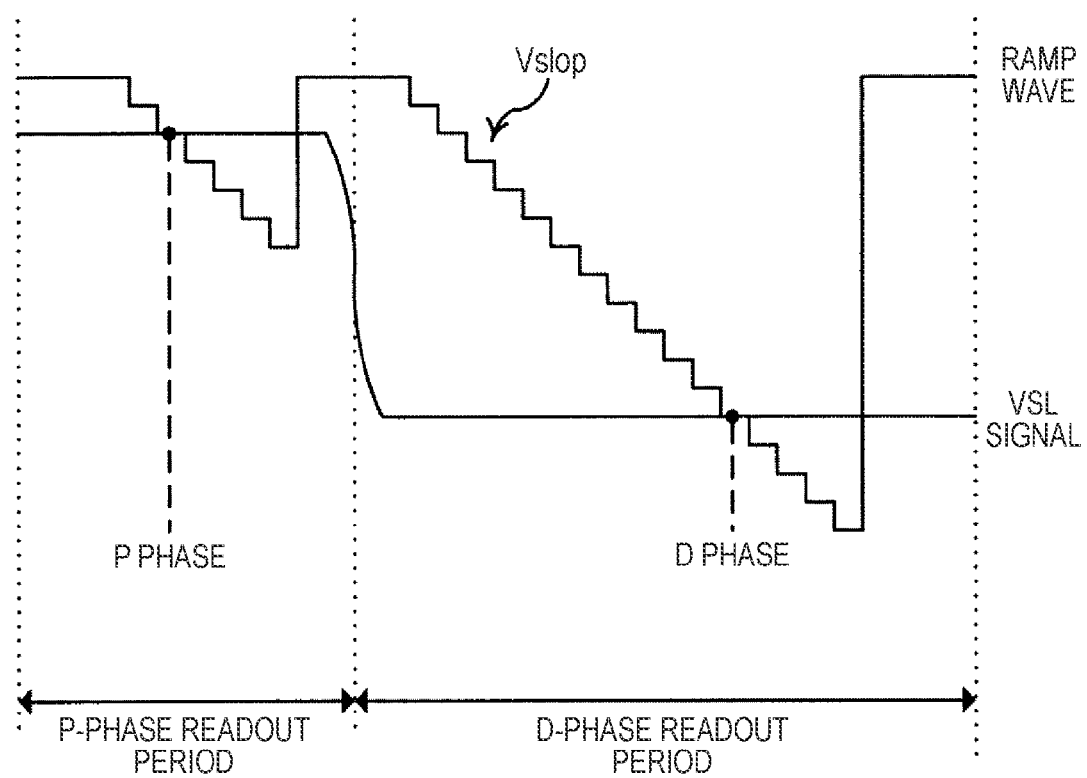
FIG. 15 is a diagram showing an example of a ramp waveform generated by the DA converter shown in FIGS. 12 and 13 and the operation timing of ADC.

FIG. 15 is a diagram showing an example of a ramp waveform (RAMP) generated by the DAC shown in FIGS. 12 and 13 and the operation timing of ADC.

In the ADC group 150, ADCs are disposed at a plurality of columns.

The DA converter 161 generates a reference voltage Vslop having a ramp waveform (RAMP) obtained by stepwise changing of a reference voltage, as shown in FIG. 15.

Each ADC has a comparator 151 that compares an analog signal (potential VSL) obtained from pixels in each row line via the vertical signal line 116 with the reference voltage Vslop.

In addition, each ADC has a counter 152 that counts a comparison time and a latch (memory) 153 that holds a count result.

The ADC group 150 has a k-bit digital signal conversion function and is disposed for each vertical signal line (column line), whereby a column-parallel ADC block is formed.

The output of each latch 153 is connected to a horizontal transfer line LTRF having, for example, a k-bit width.

In addition, k amplifier circuits 170 corresponding to the horizontal transfer line LTRF and the signal processing circuit 180 are arranged.

The specific configuration and function of the comparator 151 will be described later.

In the ADC group 150, an analog signal (potential VSL) read out to the vertical signal line 116 is compared with the reference voltage Vslop (a ramp signal RAMP of a slope waveform having a gradient and changing linearly) by the comparator 151 disposed in each column.

In this case, the counter 152 disposed in each column similar to the comparator 151 is in operation and changes its count value in one-to-one correspondence with the ramp signal RAMP (potential Vslop) having the ramp waveform, thus converting the potential VSL of the vertical signal line 116 to a digital signal.

The ADC converts a change in the reference voltage Vslop (ramp signal RAMP) to a time change and converts the time to a digital value by counting the time at a certain cycle (clock).

When the analog signal VSL crosses the ramp signal RAMP (reference voltage Vslop), an output of the comparator 151 is inverted to stop a clock input to the counter 152 or resume the clock input to the counter 152 being stopped, thus completing the AD conversion.

After completion of the above-described AD conversion period, the horizontal transfer scanning circuit 130 transfers the data held in the latches 153 to a horizontal transfer line LTRF to be input to the signal processing circuit 180 via the amplifier circuit 170, and a two-dimensional image is generated by predetermined signal processing.

The horizontal transfer scanning circuit 130 performs concurrent parallel transfer of several channels in order to ensure a transfer rate.

The timing control circuit 140 generates timing signals necessary for signal processing by respective blocks such as the pixel section 110 and the ADC group 150.

The signal processing circuit 180 at the succeeding stage performs digital signal processing for the signal stored in the line memory 190. This digital signal processing includes correction of vertical line defects and point defects, signal clamping, parallel-serial conversion, compression, encoding, addition, averaging, intermittent operation and the like.

The line memory 190 stores digital signals transmitted from each pixel row.

In the solid-state imaging device 100 of the present embodiment, a digital output of the signal processing circuit 180 is transmitted as an input to an ISP and a baseband LSI.

Next, an operation of the above-described configuration will be described.

In the DA converter 161, the reference voltage Vslop is generated in a P-phase period.

In each column processing circuit (ADC) 150, the analog signal potential VSL read out to the vertical signal line 116 is compared with the reference voltage Vslop changing in a stepwise manner by the comparator 151 disposed in each column.

In this case, until the analog potential VSL crosses the level of the reference voltage Vslop and the output of the comparator 151 is inverted, the counter 152 performs the count operation, and the potential (analog signal) VSL of the vertical signal line 116 is converted (AD-converted) to the digital signal.

This AD conversion converts a change in the reference voltage Vslop, which is a slope waveform having a gradient and changing linearly, to a time change and converts the time to a digital signal by counting the time at a certain cycle (clock).

When the analog signal VSL crosses the reference voltage Vslop, the output of the comparator 151 is inverted and the input of the clock CLK to the counter 152 is stopped, thus completing the AD conversion.

This AD conversion is performed twice by one readout operation.

The first AD conversion is performed when the reset level of the pixel circuit 101A is read out to the vertical signal line 116 (P-phase readout).

A variation in each pixel is included in the P-phase reset level.

The second AD conversion is performed when signals that are photoelectrically converted by each pixel circuit 101A are read out to the vertical signal line 116 (D-phase readout).

Since a variation in each pixel is also included in the D-phase level, by summing the conversion results in the P phase and the D phase to calculate (D-phase level)-(P-phase level), correlated double sampling (CDS) can be realized.

Then, the horizontal (column) transfer and scanning circuit 130 sequentially reads out the converted digital signals to the amplifier circuit 170 via the horizontal transfer line LTRF as a final output.

The column-parallel output processing is performed as described above.

The CMOS image sensor 100 which is the solid-state imaging device according to the fifth embodiment of the present invention employs any one of the DA converters according to the first to fourth embodiments in the DA converter (DAC) 161 that supplies a reference voltage to an AD converter (ADC).

Therefore, according to the solid-state imaging device, it is possible to reduce noise generated during AD conversion and to thus improve the quality of final images.

Moreover, the DA converters according to the first to fourth embodiments can be applied to a DA converter which is disclosed in JP-A-2007-059991 and which generates a reference signal for single-slope integration-type AD conversion.

In this case, the voltage Vbias output from the gain adjustment current source cell (308) disclosed in JP-A-2007-059991 is a voltage that controls the current value of the current source cell (355) of the first DA conversion section (302).

By sampling and holding the bias signal Vbias, it is possible to reduce the thermal noise or 1/f noise generated in the second DA conversion section (304) and the thermal noise or 1/f noise generated in the gain adjustment current source cell (308). Furthermore, by using the low consumption current driving in combination, it is possible to reduce the amount of current consumed by the second DA conversion section (304) and the gain adjustment current source cell (308).

Here, the reference numerals in parentheses are referenced from those in JP-A-2007-059991.

The solid-state imaging device having the above-described advantages can be used as imaging devices for digital cameras and video cameras.

<6. Sixth Embodiment>
[Exemplary Configuration of Camera System]

Figure 16:
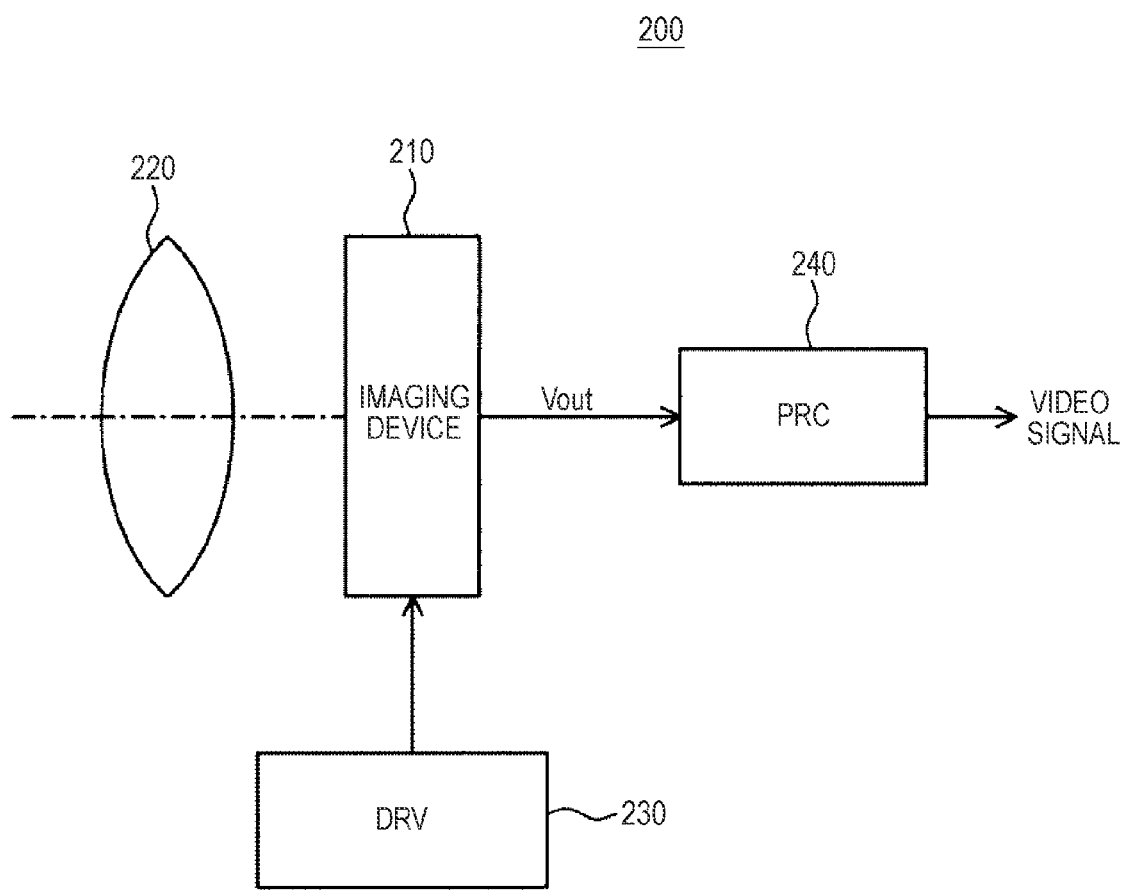
FIG. 16 is a diagram showing an exemplary configuration of a camera system to which a solid-state imaging device according to the embodiment of the present invention is applied.

FIG. 16 is a diagram showing an exemplary configuration of a camera system to which a solid-state imaging device according to the sixth embodiment of the present invention is applied.

As shown in FIG. 16, this camera system 200 has an imaging device 210 to which the solid-state imaging device 100 according to the embodiment of the present invention can be applied.

The camera system 200 has a lens 220 that forms an image of incident light (image light) on an imaging surface, for example, as an optical system that guides incident light to a pixel area of the imaging device 210 (i.e., forms an image of a subject).

The camera system 200 further has a driver circuit (DRV) 230 that drives the imaging device 210 and a signal processing circuit (PRC) 240 that processes an output signal of the imaging device 210.

The drive circuit 230 has a timing generator (not shown) that generates various timing signals, including a start pulse and a clock pulse, for driving the circuits in the imaging device 210, and drives the imaging device 210 by using a predetermined timing signal.

The signal processing circuit 240 performs predetermined signal processing on the output signal of the imaging device 210.

An image signal processed by the signal processing circuit 240 is recorded in a recording medium, for example, a memory. The image information recorded in the recording medium is printed on paper as a hardcopy by a printer or the like. Moreover, the image signal processed by the signal processing circuit 240 is displayed as a moving image on a monitor including a liquid crystal display or the like.

As described above, by mounting the solid-state imaging device 100 as the imaging device 210 on the imaging apparatus such as a digital still camera, it is possible to achieve a high-accuracy camera.

The present application contains subject matter related to that disclosed in Japanese Priority Patent Application JP 2009-105929 filed in the Japan Patent Office on Apr. 24, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A digital-to-analog (DA) converter comprising:
an analog output section that generates an output current corresponding to a value of a digital signal in response to a bias voltage and outputs an analog signal which is obtained from the output current by current-to-voltage conversion;
a current source;
a current control section that converts a current from the current source to a voltage signal and outputs the voltage signal as the bias voltage; and
a sample and hold circuit section that samples and holds the bias voltage from the current control section and supplies the held bias voltage to the analog output section.
2. The DA converter according to claim 1,
wherein the sample and hold circuit section includes at least
a sampling switch connected between a first bias line via which the bias voltage is supplied to the analog output section and a second bias line via which the bias voltage is output to the current control section, and
a hold capacitor connected to a side of the first bias line, wherein the sampling switch is held in an ON state during a sampling period so that the bias voltage from the current control section is transferred towards the hold capacitor, and wherein the sampling switch is held in an OFF state during a hold period so that the bias voltage is held in the hold capacitor.

3. The DA converter according to claim 2, wherein the sample and hold circuit includes a switching transistor that forms the sampling switch, and a cancellation transistor connected to the first bias line so as to cancel at least feedthrough caused by switching, and wherein the switching transistor and the cancellation transistor are complementarily turned on and off.

4. The DA converter according to any one of claims 1 to 3, wherein the current control section has a function of stopping supply of the current from the current source for outputting the bias voltage during the hold period of the sample and hold circuit section.

5. The DA converter according to any one of claim 1 to 3, wherein the analog output section includes a plurality of basic current source cells, each basic current source cell including a differential transistor pair and transistors serving as a current source of the differential transistor pair, in which a common bias voltage is supplied to control terminals of the transistors serving as the current source, wherein the analog output section adds current outputs of selected cells of the basic current source cells to generate the output current.

* * * * *